United States Patent [19]

Erhardt

[11] Patent Number: 4,588,899
[45] Date of Patent: May 13, 1986

[54] ALIGNMENT METHOD

[75] Inventor: Harry G. Erhardt, Falls Township, Bucks County, Pa.

[73] Assignee: RCA Corporation, Princeton, N.J.

[21] Appl. No.: 618,452

[22] Filed: Jun. 7, 1984

[51] Int. Cl.⁴ .......................................... G01N 21/00
[52] U.S. Cl. .................................................. 250/491.1
[58] Field of Search ............... 250/491.1, 492.1, 492.2, 250/492.3; 356/399, 400; 350/167; 33/286

[56] References Cited

U.S. PATENT DOCUMENTS

| | | | |
|---|---|---|---|
| 3,588,347 | 6/1971 | Montone | 250/491.1 |
| 3,873,210 | 3/1975 | Konopka | 356/138 |
| 3,885,876 | 5/1975 | Konopka | 356/153 |
| 4,335,313 | 6/1982 | Kreuzer | 250/491.1 |
| 4,427,824 | 9/1984 | Buckley | 378/34 |
| 4,524,127 | 6/1985 | Kane | 430/321 |

FOREIGN PATENT DOCUMENTS 101804 8/1980 Japan .................... 356/400

OTHER PUBLICATIONS

"Design and Performance of 64×128 Element PtSi Schottky-Barrier Infrared Charge-Coupled Device (IRCCD) Focal Plane Array", W. F. Kosonocky et al., SPIE, vol. 344—Infrared Sensor Technology, 1982, pp. 66–76.

Primary Examiner—Bruce C. Anderson
Assistant Examiner—Paul A. Guss
Attorney, Agent, or Firm—Birgit E. Morris; Donald S. Cohen

[57] ABSTRACT

A lenticular array which is a body having a flat surface and an opposed surface with a plurality of convex lenses thereon is aligned with a substrate having a pattern therein by placing the lenticular array over the substrate with the flat surface facing the substrate. Radiant energy is directed through the substrate and the lenticular array to project the patterns onto the lens surface of the lenticular array. The lenticular array is moved with respect to the substrate until the images of the patterns are aligned on the surfaces of the lenses.

12 Claims, 3 Drawing Figures

ALIGNMENT METHOD

The present invention relates to a method of achieving alignment between two overlapping parts, particularly a wafer of semiconductor material having features formed therein and another part, such as a mask or lens array.

BACKGROUND OF THE INVENTION

In making various types of semiconductor devices it is often necessary to align a semiconductor wafer with another object so that features formed in the wafer are aligned with features in the object. For example, an infra-red charge-coupled device (IR-CCD) imager has been developed which includes an array of infra-red sensitive regions in a substrate of semiconductor material for detecting an image with a charge-coupled device (CCD) register as a read-out for the detectors. (See DESIGN AND PERFORMANCE OF 64×128 ELEMENT PtSi SCHOTTKY-BARRIER INFRARED CHARGE-COUPLED DEVICE (IR-CCD) FOCAL PLANE ARRAY by W. F. Kosonocky et al. published in SPIE, Volume 344, Infra-Red Sensor Technology (1982), pp. 66∝77). One problem with such imagers is to achieve a high fill-factor in order to improve the sensitivity of the imager. "Fill-factor" is used to describe the ratio of the active detector area to the total area of the imager. Thus, the structure of the imager which is between the detector areas, such as the CCD registers used to carry charge from the detector areas, take up area on the device which receives the signal to be detected but do not convert the received signal to a detected signal. One method which has been developed to overcome this problem is to mount a lenticular array on the device so that the lenses of the array focus the incoming signals to the detector areas of the imager. This method is described in U.S. Pat. No. 4,524,127, to James Kane, entitled "Method of Fabricating A Silicon Lens Arry", issued June 18, 1985 (filed Apr. 27, 1983) and assigned to the same assignee as the present application. However, a problem with the use of such lenticular arrays is achieving good alignment of the lenses with the detectors.

Another example where good alignment is required is in making integrated circuits. In the manufacture of integrated circuits, patterns are formed in the semiconductor substrate and in layers of various materials coated on the surface of the substrate using a photoresist and masks. Each mask defines a pattern to be formed and must be aligned with the patterns previously formed in the integrated circuit. Because of the very small size of the integrated circuit, and thus the patterns being formed, the alignment of the mask with the integrated circuit is relatively complex requiring the use of a microscope and special alignment keys in the integrated circuit and the mask.

SUMMARY OF THE INVENTION

Alignment to an article which includes a substrate having a pattern at one surface thereof is achieved by placing adjacent the article a lenticular array and directing radiant energy through the article. Relative movement between the lenticular array and the article is provided until the pattern appears on and is in alignment with the lenses of the lenticular array.

DETAILED DESCRIPTION OF PREFERRED EMBODIMENT

Figure 1:
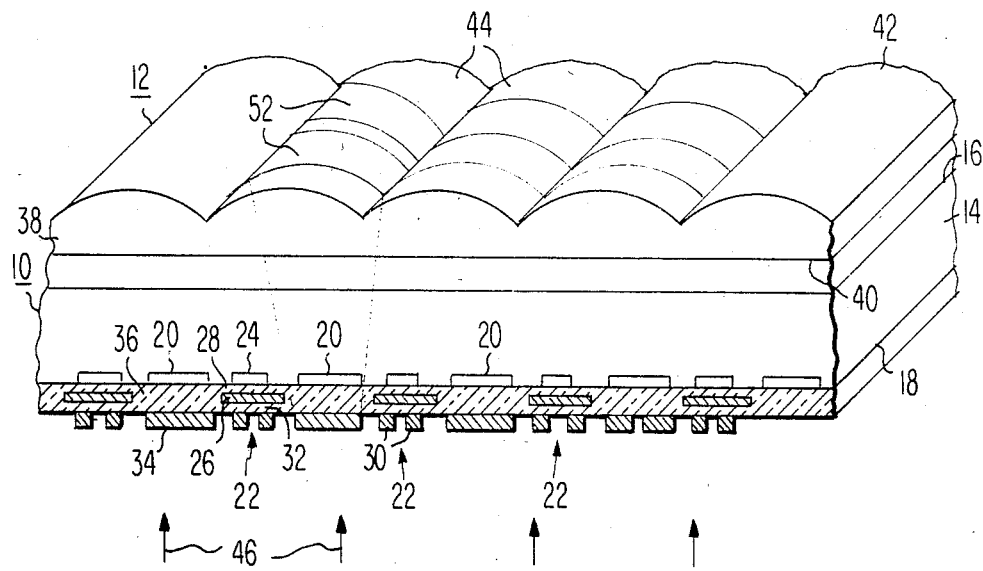
FIG. 1 is a perspective view of a portion of an infrared charge-coupled device imager having a lenticular array thereon and aligned therewith by the method of the present invention.

Referring to FIG. 1 there is shown an IR-CCD imager 10 having a lenticular array 12 mounted thereon and aligned therewith by the method of the present invention. The IR-CCD imager 10 includes a substrate 14 of single crystalline silicon having opposed major surfaces 16 and 18. At the surface 18 are a plurality of IR detectors 20. As described in the previously referred to article of W. F. Kosonocky et al., each of the detectors 20 may be a rectangular array of a conductive material, such as platinum silicide or palladium silicide, formed along the substrate surface 18 and forming a Schottky-barrier with the substrate 14. Alternatively, the detectors 20 can be made of any other well-known material which will connect radiant energy to an electrical charge, such as HgCaTe, InSb, intrinsic silicon or such detectors of visible radiant energy as a charge-coupled device. The detectors 20 are arranged in parallel columns along the substrate surface 18 with the detectors 18 being uniformly spaced along each column. Between the columns of the detectors 20 are CCD registers 22. Each CCD register 22 includes a channel 24 in the form of a region of a conductivity opposite to that of the substrate within the substrate 14 and extending along the surface 18 for the full length of the column of detectors 20. A plurality of gates 26 are positioned along and extend transversely across the channel 24. The gates 26 are of a conductive material, such as conductive polycrystalline silicon, and are insulated from the substrate surface 18 by a layer 28 of silicon oxide. Parallel buss lines 30 extend longitudinally over the gates 26 and are insulated therefrom by a layer 32 of silicon oxide. The buss lines 30 are of a conductive material, such as aluminum, and each is connected to various ones of the gates 26 through openings in the silicon oxide layer 32. A separate mirror 34 is over each of the detectors 20 and is spaced therefrom by a layer 36 of silicon oxide. The mirrors 34 are of a metal, such as aluminum, and are of a size and shape corresponding to that of the detectors 20.

The lenticular array 12 is a body 38 of a material which is transparent to the radiation being detected by the imager 10. For detecting infra-red radiation, the body 38 can be of single crystalline silicon. The body 38 has a pair of opposed major surfaces 40 and 42. The surface 40 is flat and the surface 42 has formed therein a plurality of parallel, convex lenses 44. The periodicity of the lenses 44 is equal to that of the columns of detectors 20 so that there is one lens 44 for each column of detectors 20. The lenticular array 12 is mounted on the imager 10 with the flat body surface 40 being in spaced opposed relation to the substrate surface 16, and the lenticular array 12 is secured to the imager 10 with a suitable bonding medium. One method for bonding the lenticular array 12 to the imager 10 is described in my co-pending application Ser. No. 618,453 entitled, "IR-CCD Imager and Method of Making The Same", filed June 7, 1984.

Figure 2:
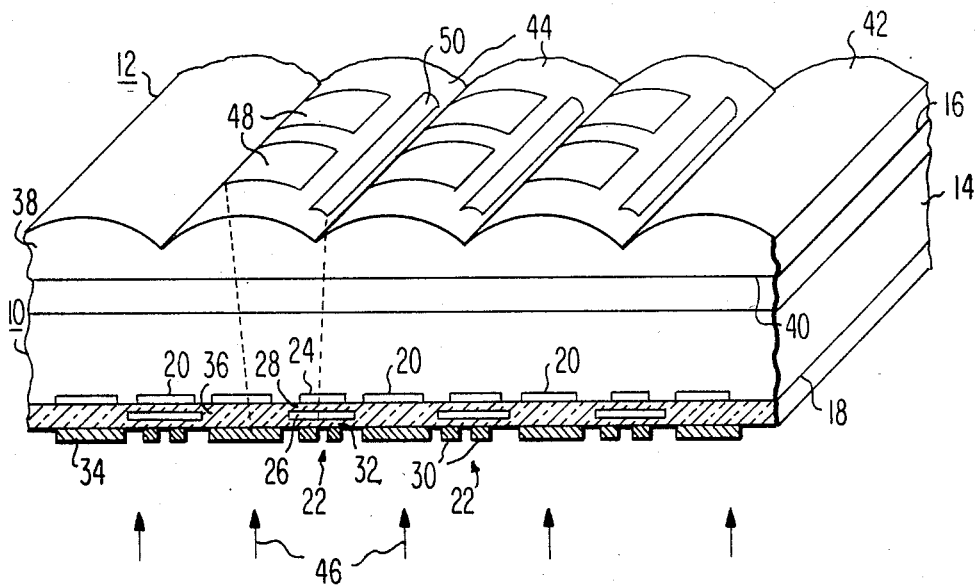
FIG. 2 is a perspective view similar to FIG. 1 illustrating misalignment between the lenticular array and the imager.

The lenticular array 12 is positioned on the imager 10 with the lenses 44 extending in the same direction as the columns of detectors 20. The lenticular array 12 is then moved with respect to the imager 10 until all of the detectors 20 in each column are aligned with a respective one of the lenses 44. In accordance with the method of the present invention this alignment is achieved by directing infra-red radiant energy through the imager 10 and the lenticular array 12 in the direction of the arrows 46. The silicon of the imager 10 and the lenticular array 12 is transparent to infra-red radiant energy so that it will allow the infra-red radiant energy to pass therethrough. However, the metal of the mirrors 34 and buss lines 30 are opaque to infra-red radiant energy. Also, the lenses 44 are magnifiers when viewed from the surface 42 of the body 38. Since the mirrors 34 and the buss lines 30 are opaque to the radiation, they will appear as dark areas at the convex surfaces of the lenses 44 when viewed substantially normal to the lenticular array. If the lenticular array is positioned with respect to the imager 10 so that the lenses 44 are not in complete alignment with the columns of detectors 20, dark areas 48 and 50 corresponding to portions of the mirrors 34 and buss lines 30 respectively will appear at the convex surfaces of the lenses 44 as shown in FIG. 2. When the lenticular array 12 is moved with respect to the imager 10 so that the lenses 44 are in direct alignment with the columns of detectors 20, dark areas 52 resulting only from the mirrors 34 will appear at the convex surfaces of the lenses 44 as shown in FIG. 1. Thus, the lenticular array 12 can be readily aligned with each lens 44 being directly over a column of the detectors 20 by moving the lenticular array 12 until only the magnified shapes of the mirrors 34 appear along the entire length of the lenses 44. Once the lenticular array 12 is properly aligned on the imager 10, the bonding material securing the lenticular array 12 to the imager 10 can be hardened.

In the structure of the imager 10 shown in FIG. 1, the mirrors 34 cover a relatively larger portion of the area which will be viewed at the surface 42 of the lenses 44 and thereby block out a large portion of the radiant energy which will pass through the lenticular array 12. Thus, an alternate method of determining when the lenticular array 12 is properly aligned with the imager 10 is to measure the amount of the radiant energy which passes through the lenticular array 12, using a suitable detector. When the quantity of radiant energy passing through the lenticular array is detected to be at a minimum then the mirrors 34 are properly aligned with the lens 44. This allows the automatic alignment of the lenticular array 12 with the imager 10 using the output of the radiant energy passing through the lenticular array 12 as the means for stopping the movement of an automatic alignment apparatus.

Figure 3:
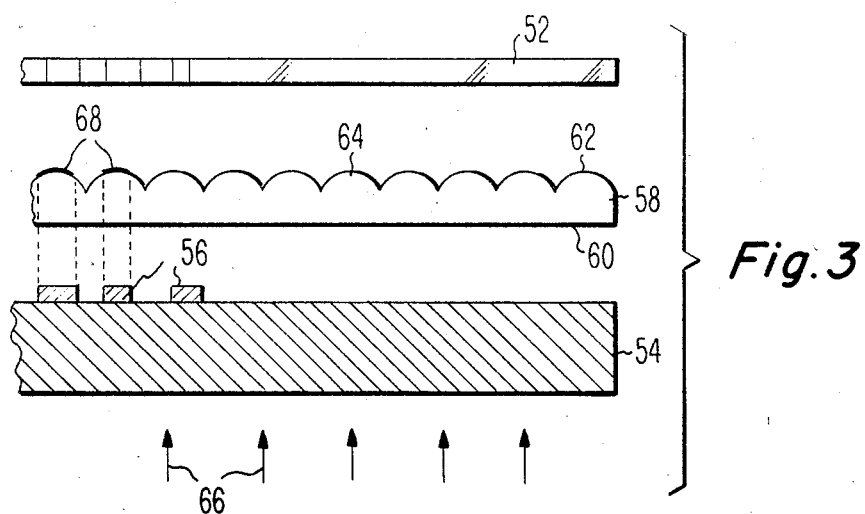
FIG. 3 is a schematic view showing the use of the method of the present invention for aligning a mask with a wafer of semiconductor material in which an integrated circuit is being formed.

Referring to FIG. 3, there is shown the use of the method of the present invention for aligning a mask 52 with regard to an integrated circuit 54. The integrated circuit 54 is a substrate of single crystalline silicon having a pattern 56 on a surface thereof. The pattern 56 can be formed of an insulating material, such as silicon oxide or silicon nitride, or a conductive material, such as a metal. Instead of being formed on the surface of the substrate 54, the pattern 56 can be formed of regions within the substrate 54 along the surface thereof. The mask 52 is generally a body of transparent material, such as glass, having a desired pattern formed either in the body or on the surface thereof. The body of the mask 52 may be transparent to the radiation to be used with the pattern being opaque or vice versa.

To align the pattern of the mask 52 with the pattern 56 of the integrated circuit 54, a lenticular array 58 is positioned therebetween. To lenticular array 58 is a body of a material which is transparent to the radiation to be used and has a pair of opposed major surfaces 60 and 62. The surface 60 which faces the integrated circuit 54 is flat and the surface 62 which faces away from the integrated circuit 54 has a plurality of convex lenses 64 formed therein. Radiation is directed through the integrated circuit 54 and the lenticular array 58 in the direction indicated by the arrows 66. The radiation used is one which is transmissive through the material of the integrated circuit 54 and the lenticular array 58 but has a different transmissivity through the material of the pattern 56. The lenticular array 58 is positioned with respect to the integrated circuit 54 so that the pattern 56 will be magnified at the surface of the lenses 64. By using a radiation which has a different transmissivity through the material of the pattern 56 than through the integrated circuit 54, the pattern will appear as a magnified area 68 on the surface of the lens 64 which can be readily seen. The mask 52 can then be easily aligned with the magnified pattern 68 and will be therefor aligned with the pattern 56 when the lenticular array 58 is removed from between the mask 52 and the integrated circuit 54. Thus, the lenticular array 58 provides a magnified reproduction of the pattern 56 on the integrated circuit 54 to permit means of aligning the mask 52 with the integrated circuit 54.

I claim:

1. In a method of achieving alignment to an article which includes a substrate having a pattern of a material at one surface thereof the steps of, placing adjacent said article a lenticular array, directing radiation energy through the article, and providing relative movement between the lenticular array and the article until the entire image of the pattern appears on and is in alignment with the lenses of the lenticular array when viewed substantially normal to the surface of the lens.

2. A method in accordance with claim 1 wherein the lenticular array is a body having a pair of opposed major surfaces one of which is flat and the other has a plurality of convex lenses therein and the lenticular array is positioned with the flat surface facing the article so that the lens magnifies the pattern on the surface thereof.

3. A method in accordance with claim 1 wherein the radiant energy is transmissive through the substrate of the article and the lenticular array and has a different transmissivity through the pattern on the article.

4. A method in accordance with claim 3 wherein the radiant energy is infra-red and the article substrate and the lenticular array are made of silicon.

5. A method of mounting a lenticular array on an infra-red charge-coupled device imager which includes a substrate of single crystalline silicon having along one surface thereof a plurality of areas of a metal with the lenses of the lenticular array being aligned with certain of the metal areas comprising the steps of positioning the lenticular array over the substrate, direct radiant energy through the substrate and the lenticular array from the side of the substrate away from the lenticular array, and moving said lenticular array with respect to the substrate until the entire image of the pattern of the metal areas appears on the surfaces of the lenses of the lenticular array as viewed substantially normal to the surface of the lenses.

6. A method in accordance with claim 5 in which the lenticular array is a body having a pair of opposed major surfaces one of which is flat and the other has a plurality of convex lenses thereon, and the lenticular array is positioned with the flat surface being opposed to a surface of the imager substrate.

7. A method in accordance with claim 6 in which the radiation is infra-red and the lenticular array is transparent to said radiation.

8. A method in accordance with claim 6 in which the metal areas on the imager substrate are arranged in columns and the lenticular array is moved until the images of each column appears on the surface of the separate lens.

9. A method of aligning a mask having a pattern thereon with a semiconductor substrate having a pattern therein comprising the steps of placing over the substrate a lenticular array, directing radiant energy through the substrate and the lenticular array from the side of the substrate away from the lenticular array, moving said lenticular array with respect to the substrate until the entire pattern on the substrate appears on the surface of the lens of the lenticular array when viewed substantially normal to the surface of the lens, placing the mask over the lenticular array, and aligning the pattern of the mask with the pattern of the substrate which is projected at the surface of the lens of the lenticular array.

10. A method in accordance with claim 9 in which the lenticular array is a body having a pair of opposed major surfaces one of which is flat and the other has a plurality of convex lenses thereon, and the lenticular array is positioned with its flat surface facing the substrate.

11. A method in accordance with claim 10 in which the radiant energy is transmissive through the substrate and the lenticular array and has a different transmissivity through the pattern on the substrate.

12. A method in accordance with claim 9 in which after the pattern on the mask is aligned with the pattern projected at the surfaces of the lenses, the lenticular array is removed from between the mask and the substrate.

* * * * *

UNITED STATES PATENT AND TRADEMARK OFFICE
CERTIFICATE OF CORRECTION

PATENT NO. : 4,588,899

DATED : May 13, 1986

INVENTOR(S) : Harry Gene Erhardt

It is certified that error appears in the above-identified patent and that said Letters Patent is hereby corrected as shown below:

Column 1, line 26, "∝" should be -- - --.
Column 1, line 38, "signals" should be --signal--.
Column 1, line 41, "Arry" should be --Array--.
Column 2, line 25, "array" should be --area--.
Column 4, line 28, "lens" should be --lenses--.
Column 4, line 42, "radiation" should be --radiant--.
Column 4, line 46, "substantially normal to" should be deleted and --at-- should be substituted.
Column 4, line 68, --and-- should be after "substrate".
Column 5, line 1, "direct" should be --directing--.
Column 5, line 7, "substantially normal to" should be deleted and --at-- should be substituted.
Column 5, line 22, "the" second occurrence should be --a--.
Column 6, line 7, "substantially normal to" should be deleted and --at-- should be substituted.

Signed and Sealed this

Nineteenth Day of August 1986

[SEAL]

Attest:

DONALD J. QUIGG

Attesting Officer

Commissioner of Patents and Trademarks